United States Patent
Wendel et al.

(10) Patent No.: US 6,912,473 B2
(45) Date of Patent: Jun. 28, 2005

(54) METHOD FOR VERIFYING CROSS-SECTIONS

(75) Inventors: Dieter Wendel, Schoenaich (DE); Alexander Albert Woerner, Waiblingen (DE)

(73) Assignee: International Business Machines Corporation, Armonk, NY (US)

( * ) Notice: Subject to any disclaimer, the term of this patent is extended or adjusted under 35 U.S.C. 154(b) by 106 days.

(21) Appl. No.: 10/610,094

(22) Filed: Jun. 30, 2003

(65) Prior Publication Data

US 2004/0002831 A1 Jan. 1, 2004

(30) Foreign Application Priority Data

Jun. 28, 2002 (EP) .............................................. 02014399

(51) Int. Cl.[7] .......................... G01R 27/28; G01R 31/00; G01R 31/14; G06F 19/00
(52) U.S. Cl. ..................................................... 702/119
(58) Field of Search ........................... 702/119; 703/14, 703/27; 364/488, 578; 371/26

(56) References Cited

U.S. PATENT DOCUMENTS

| | | | |
|---|---|---|---|
| 5,553,008 A | * | 9/1996 | Huang et al. ................. 703/14 |
| 5,838,948 A | * | 11/1998 | Bunza .......................... 703/27 |
| 5,883,814 A | * | 3/1999 | Luk et al. ...................... 716/2 |
| 6,434,727 B1 | * | 8/2002 | Ishii et al. ..................... 716/6 |

* cited by examiner

*Primary Examiner*—Michael Nghiem
*Assistant Examiner*—Aditya S. Bhat
(74) *Attorney, Agent, or Firm*—John E. Campbell; Floyd A. Gonzalez

(57) ABSTRACT

A method, program product and computer system for hardware design and simulation thereof. In particular, the schematic description of a respective hardware macro is analyzed during the design of macros, and arrays. A path is traced in the schematic of said macro from a start point to an end point along a given hierarchy, collecting the relevant information of each cell found in the schematic being relevant for timing analysis of the macro, resolving the hierarchy structure of cells in the schematic in order to gain information about the selected path, and outputting information in a form which allows comparing, for example, a representation to be used for exact timing verification, a so called cross-section, with the macro schematic.

9 Claims, 3 Drawing Sheets

METHOD FOR VERIFYING CROSS-SECTIONS

BACKGROUND OF THE INVENTION

The present invention relates to hardware design and simulation and in particular, it relates to the design of hardware macros and arrays specifically. In particular it relates to a method for analyzing the macro schematic and the cross-section of a respective macro.

Large scale integrated circuits (LSI) or very large scale integrated circuits (VLSI) are current state-of-the-art hardware components. In order to develop such hardware components which are operated with clock rates of more than one Gigahertz the timing behavior of such components must be analyzed already in early stages of hardware development. The component is divided in manageable objects, so called macros. These macros are characterized by a macro specific timing specification. Macros are assumed in here to include both, logic and array-type switching structures.

In prior art, pre-product hardware, so called testsites, are usually developed, for example an array design. The simulation of this kind of macro is then verified and adjusted according to the hardware results to make sure that the signal propagation time within the wires and electric elements, for example transistors are adapted to the intended function of the respective logic macro or array circuit. This step includes the observation and control of race conditions.

In particular, when designing a hardware macro, i.e. a complex agglomeration of highly integrated logic circuits, in prior art usually a so-called schematic is generated which reflects part of the logical structure of the macro. Further, a so-called layout of the macro is generated which represents the physical structure of it. Both correspond to each other.

The straight forward approach in hardware simulation would now be to run a simulation which comprises the whole schematic of the macro. In spite of the above mentioned requirements regarding signal propagation time and in general the run-time behavior of the macro, any wire element must be included into this intended simulation. Further, any switching element, any load switched in parallel to one selected electrical path to be simulated is required to be included in said "ideal simulation". This requirement, however, can not be met because there are far too many physical elements to simulate, which can not be handled by current timing simulation tools.

Thus, in prior art, so-called cross-sections are generated which represent a typical electrical path, for example, from an input pin of a macro to an output pin of the macro. Thus, such a cross-section represents only a specific part of the macro which is currently of interest, for example one bit of a 64 bit data path. This basic cross-section oriented approach helps to reduce the memory requirements and the required run time for a later simulation of the cross-section. The cross-section in turn comprises the above mentioned loads switched in parallel to the selected electrical path.

An independent model of the macro to be analyzed is thus introduced in prior art with the so called cross-section. Hereby, a problem arises which is the verification of said cross-sections against the full macro logic description, herein referred to as schematic. This problem is tried to be solved in prior art by producing a small, number of hardware chips implementing the hardware according to the given schematic, and measuring the run-time behavior along different electrical paths in the macro and comparing the measured data with the simulation results obtained by simulating one or more of the cross-sections representing the macro. This approach, however, has the disadvantage that hardware development is slow and expensive and thus not efficient.

Thus, it is desirable to have a reliable verification of a given cross-section or of a plurality of them against the full logic description comprised of the schematic. This desire is even increased in recent years since the increasing chip cache sizes and rising clock frequencies have urged the need for verification of the cross-sections even more, because the narrowing allowable technical tolerances increase the risk of circuit failures accordingly.

BRIEF SUMMARY OF THE INVENTION

It is thus an objective of the present invention to provide a method and respective system which allows an improved verification of cross-sections with the topological information comprised of the logical macro schematic.

When viewing only a part of the information relevant for the design, different abstractions can be used. The design can be viewed as a schematic which is a diagrammatic description of a circuit. Or it can be viewed as a layout which is a collection of polygons on different layers of a chip.

For an easier handling of the design complexity, a hierarchical structure can be used. Structural hierarchy views an object as parts composed of other subparts in a recursive manner. The subparts are commonly referred to as cells or macros. The use of such a subpart at a given level is called an instance of this subpart. This implies that the entire content of the subpart is present at that point in the final design. Multiple usage of the same subpart indicates that the subparts contents are to be repeated at each instance of the subpart.

The lowest level of the hierarchy is reached when all subparts are basic components. These basic components are called primitive or leaf cells. Also available layout information (resistance and capacity) is translated into an appropriate wire model. The wire models, together with the models of the active elements, as transistors, simulate the timing behavior of the paths.

The top level cell (or root cell or macro) is not contained as an instance in any other cell and therefore at the top of the hierarchy. All other cells are called hierarchical cells or composition cells. Thus, up to ten levels are found in a prior art hardware macro until—beginning from the highest level—the lowest level is reached.

According to the inventional principle another category of cells exists. The term "special cell" is used for all leaf cells that have additional information, needed for electrical simulation and not necessary to describe the logical behavior, that needs to be handled accordingly. Examples of such special cells are wire models, load multipliers, resistors, and sources of voltage or current.

All instances are connected with so-called nets. I.e., in the context of electrical circuits these nets represent the wires, the signals move across.

A path is the interconnection of a cell with other cells with such nets. All paths in a design make up the topology of the design.

Such paths are thus used as the primary approach of the present invention to extract relevant information for timing analysis from the schematic.

When designing a macro, a layout is required containing all instances of all cells that are used in the macro. For checking purposes a corresponding schematic of the full macro is also needed. Then a verification of the layout versus schematic can be done. Often, for simulation purposes, only a subset of paths is of interest. Then a separate schematic is created containing only those instances that have an influence on the simulated path. This separate schematic is called "cross-section" for the purpose of the present invention. Further simplifications can be done in this cross-section. Since the topology of the cross-section schematic will not be manufactured it can contain cells that do not have a physical representation, i.e. load-multipliers and wire models.

For example, in a macro schematic a bit line is connected to the plurality of 256 cells which is represented in the cross-section schematic by a single instance of a load-multiplier with a multiplication factor of 256 connected to a single instance of the cell. Therefore, the cross-section schematic usually has a different hierarchical structure and uses different primitives than the macro schematic describing the complete macro. This makes them difficult to compare.

After the above introduction to the basic approach followed by the present invention reference should now be made to the appended claims.

According to its primary aspect a method for analyzing an macro schematic of a respective hardware macro is disclosed, in which a common start point and a common end point in a cross-section representing a specific part of said macro, and a hardware macro schematic is selected, said points defining a path within said macro, whereby the method is characterized by the steps of:
a) tracing said path along a given hierarchy,
b) collecting the timing information of each cell being relevant for timing analysis of said path,
c) resolving the hierarchical structure of cells in the schematic in order to collect timing analysis information about said selected net, and
d) outputting said information in a form which allows a compare with the information comprised of said cross-section.

The primary advantage is that this method can be used for efficiently verifying already existing integrated circuit macro cross-sections by a compare with the respective macro schematic.

A further advantage is that said method can also be used for generating a cross-section in a situation in which a cross-section does not yet exist but the complete schematic is available.

Further, the step of dividing the given hardware topology information into three categories of cells:
a. hierarchical cells,
b. special cells, and
c. primitive cells,
is very useful for exploring the hardware topology in a very efficient way without spending too much computational effort into a more sophisticated structure to divide in. Thus, the steps of tracing said path recursively through a given plurality of hierarchical levels, and
entering a deeper hierarchy level when a hierarchical cell is reached, until all timing information related to primitive cells and special cells associated with said path is collected, can be performed rather quick by a respective program tool.

The inventive method may also be used for analyzing the description of a respective macro schematic which is based on optical switching elements because its fundamental principle is independent of the physics behind a particular kind of hardware topology.

When names of cells are output in a form which includes the naming conventions used in the cross-section specification, the subsequent compare step is made even more simply to be performed, either manually or by aid of a further program (module).

Thus, as can be appreciated by a person skilled in the art, the present invention is based on the idea to use topological information of paths in first the cross-section and second the macro schematic which correspond to each other for verification purposes. In particular, a path is traced throughout the hierarchy and the total width of the connected CMOS-transistor-devices, as an example for run-time relevant information, is summed up. This is basically done both, for the cross-section, and the schematic. As a result, for example a specific result is obtained from the cross-section which is able to be compared with the respective result of the same path in the macro schematic. A mismatch for example in total width indicates a mismatch between the cross-section and the macro schematic. Thus, the cross-section can be verified further to improve the behavior representing the complete schematic.

BRIEF DESCRIPTION OF THE SEVERAL VIEWS OF THE DRAWING

These and other objects will be apparent to one skilled in the art from the following detailed description of the invention taken in conjunction with the accompanying drawings in which.

DETAILED DESCRIPTION OF THE INVENTION

Figure 1A:
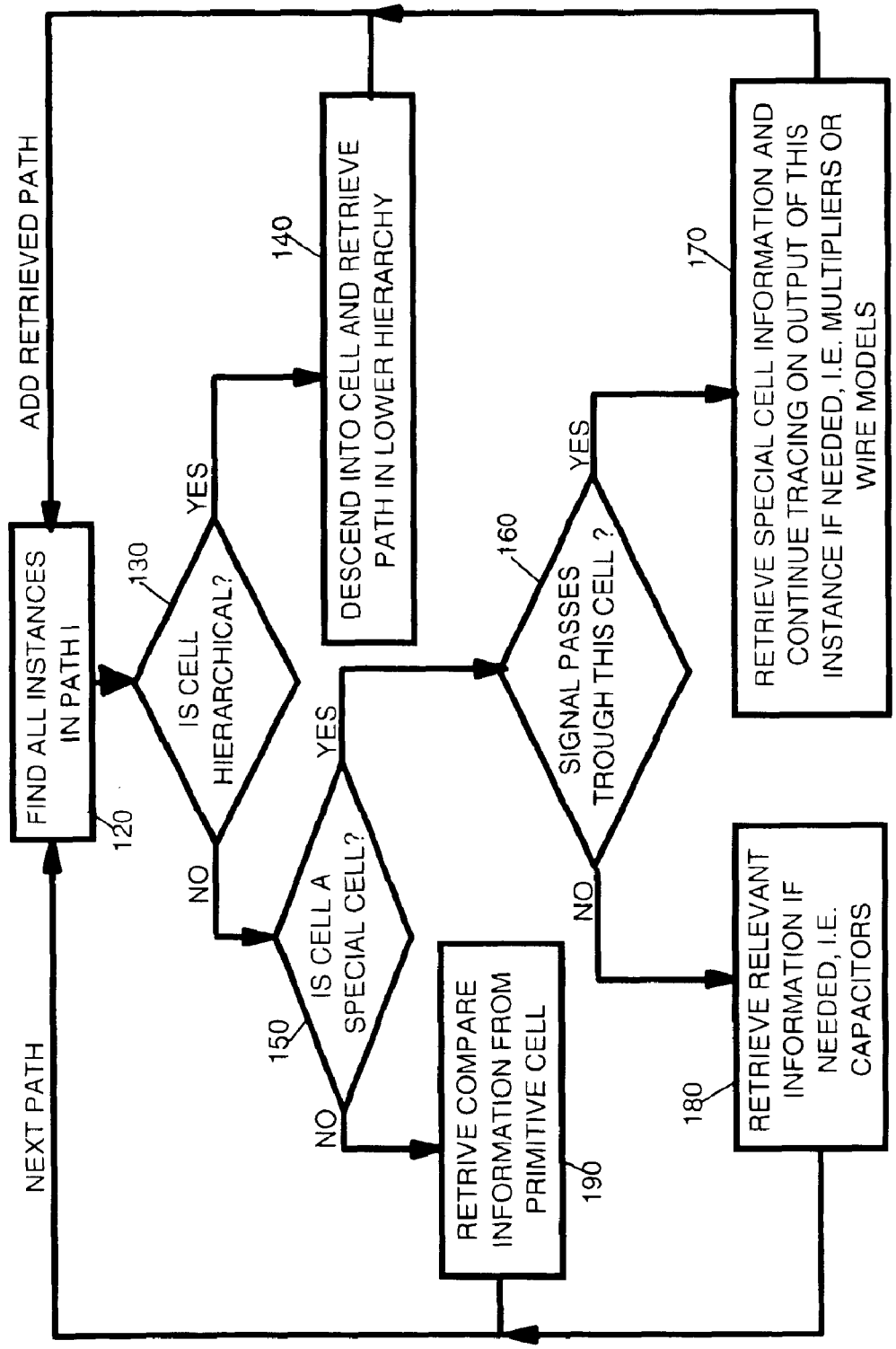
FIG. 1a is a schematic representation of the control flow in a preferred embodiment of the present invention providing an extraction of the relevant information from the schematic (macro or cross-section)

With general reference to the figures and with special reference now to FIG. 1a a more detailed description is given about the control flow in an inventive embodiment.

A path is defined as input parameters for the inventional tool. For said path all instances are extracted from the schematic which are connected to a given path i, step 120. Thus, a loop is defined.

As a first decision 130 in said loop the instance of a current cell is checked if it is a hierarchical cell or not. In the case it is a hierarchical cell (YES-branch), the cell is selected and it is descended into the current cell, and the new, more detailed path is retrieved in the next, new lower hierarchy level, step 140. Thus, all steps which were intended to be performed on the preceding upper hierarchy level are now repeated one level deeper, i.e. one level more detailed. Thus it is branched back to step 120.

In the NO-branch of decision 130 it is checked in a decision 150 if a current cell is a special cell, or not. In the yes-case it is checked in a decision 160, if the current cell passes the signal through, or not.

In the yes-branch of decision 160, in a step 170 special cell information is intended to be retrieved. Thereby, a further distinction is made between the kind of special cell that is present. I.e., in case of a load-multiplier the output net of this instance will be traced for the multiplication factor being applied to the output net. Then it is branched back to step 120 in order to find the next cell in the given, current net.

In the no-branch of decision 160 the current special cell does not pass the signal through. Examples for such cells are components like voltage suppliers and capacitors. Information about these cells is usually not of interest for the subsequent desired compare step, but it is an option within the inventive concept to collect this data. Then it is branched back to step 120.

In the no-branch of decision 150 no special cell and no hierarchical cell is found. Thus, according to the inventive approach, a primitive cell is present of which the relevant compare information is collected and stored, step 190. Then it is branched back to step 120.

Thus, as can be appreciated from a person skilled in the art, all relevant compare information is collected while tracing through the hierarchy of the schematic and is stored and summed up in either of the steps 170, 180 and 190. Thus, when the loop is completed for a given highest level path all timing analysis relevant information is collected. Thus, by virtue of repeated re-entering the loop all relevant paths are processed, thus resolving the hierarchical structure of cells in the schematic. Thus, the timing analysis information about the selected net is collected.

Figure 1B:
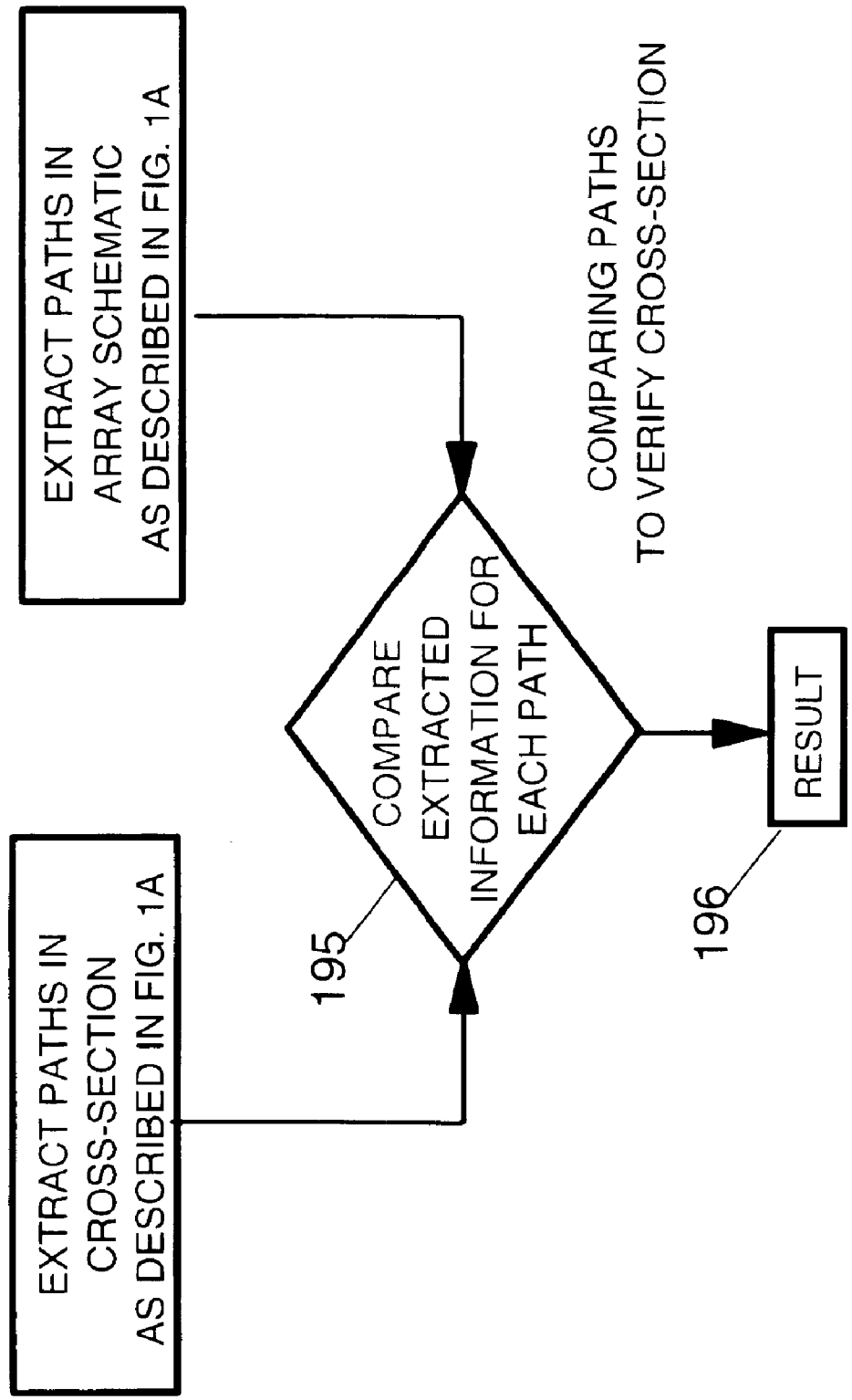
FIG. 1b is a schematic representation of the control flow in a preferred embodiment of the present invention providing a compare between the information extracted from the macro schematic and the cross-section in order to verify the cross-section.

According to the representation given in FIG. 1*b*, the compare information, i.e., relating to the extracted paths in cross-section and the extracted paths in macro schematic as retrieved from the above description of FIG. 1*a* is advantageously evaluated in a comparison 195 in order to yield a result 196 which is comparable to a respective result obtainable by analyzing the cross-section.

Figure 2:
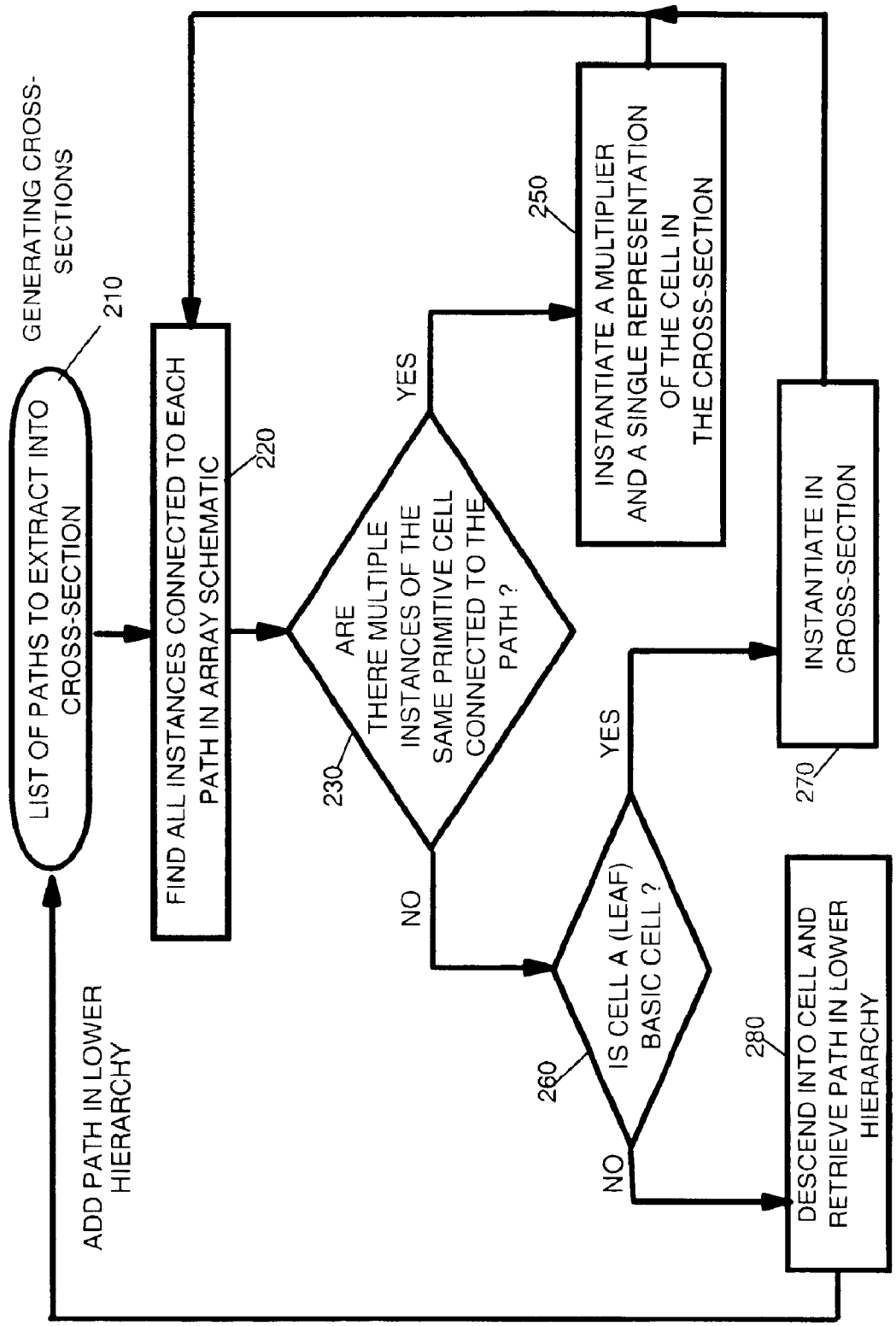
FIG. 2 is a schematic representation of the control flow according to an inventive embodiment which is used to generate a given number of cross-sections.

With reference now to FIG. 2 the control flow of a further inventive embodiment will be described in more detail next below which can be used for generating cross-sections in a situation in which a cross-section not yet exists.

In a first step 210 a list of nets to be extracted into the cross-section is defined as an input parameter for the embodiment. For each path in a step 220 all instances are found, which are connected to the current path in the macro schematic, step 220. Then, in a decision 230, it is checked, if there are multiple instances of the same primitive cell connected to the current path. In the yes-branch thereof a multiplier is instantiated as well as a single representation of the cell in the cross-section, step 250.

Then it is branched back to step 220. In the no-branch of decision 230 only one instance of this cell is present in the path. Then, for a decision 260, it is checked, if the current cell is a primitive cell, or not.

In the yes-branch of decision 260 an instance of such a primitive cell is present. Thus, an instance of this primitive cell is placed in the cross-section, step 270.

In the no-branch of step 260 no instance of a primitive cell is found. Thus, it is descended into the cell and a respective new path is analyzed, i.e. traced in the hierarchy level just below the actual one, step 280. Thus, it is branched back to step 210 in order to re-enter the control flow and repeat to add the extracted path on a lower level to the list.

Thus, after having completed all lower levels and after having collected in a respective step 270 all time analysis relevant information, the total of primitive cells has been traced for a given highest level path. Then, if the procedure is repeated for all paths required to complete a given cross-section, the cross-section can be setup directly from the collected information gathered in steps 250 or 270, respectively. Thus, as can be appreciated by a person skilled in the art a complete cross-section can be generated with the help of the inventional tool and a prior art schematic.

In the foregoing specification the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

The present invention can be realized in hardware, software, or a combination of hardware and software. A verification tool according to the present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after either or both of the following:
a) conversion to another language, code or notation;
b) reproduction in a different material form.

While the preferred embodiment of the invention has been illustrated and described herein, it is to be understood that the invention is not limited to the precise construction herein disclosed, and the right is reserved to all changes and modifications coming within the scope of the invention as defined in the appended claims.

What is claimed is:

1. A computerized method for analyzing a macro schematic of a respective hardware macro, in which a common start point and a common end point in a cross-section representing a specific part of said macro, and a hardware macro schematic is selected, said points defining a path within said macro, the method comprising the steps of:
   a) tracing said path along a given hierarchy;
   b) collecting the timing information of each cell being relevant for timing analysis of said path;
   c) resolving the hierarchical structure of cells in the schematic in order to collect timing analysis information about said selected net;
   d) outputting said information in a form which allows a compare with the information comprised of said cross-section;
   dividing the given hardware topology information into three categories of cells comprising hierarchical cells, special cells, and primitive cells;
   tracing said path through a given plurality of hierarchy levels; and
   entering a deeper hierarchy level, when a hierarchical cell is reached, until all timing information related to primitive cells and special cells associated with said path is collected.

2. The method according to claim 1, wherein:

said primitive cells comprise an actual digital switching element of the macro such as a transistor or coupling elements; and said special cells comprise load-multipliers, capacitors, resistors, wire models, and sources of voltage or current in the schematic.

3. The method according to claim 1 further comprising analyzing the description of a macro based on optical switching elements.

4. A program product for analyzing a macro schematic of a respective hardware macro, in which a common start point and a common end point in a cross-section representing a specific part of said macro, and a hardware macro schematic is selected, said points defining a path within said macro, the program product comprising:

a computer readable medium having recorded thereon computer readable program code performing the method comprising:

a) tracing said path along a given hierarchy;

b) collecting the timing information of each cell being relevant for timing analysis of said path;

c) resolving the hierarchical structure of cells in the schematic in order to collect timing analysis information about said selected net;

d) outputting said information in a form which allows a compare with the information comprised of said cross-section;

dividing the given hardware topology information into three categories of cells comprising hierarchical cells, special cells, and primitive cells;

tracing said path through a given plurality of hierarchy levels; and entering a deeper hierarchy level, when a hierarchical cell is reached, until all timing information related to primitive cells and special cells associated with said path is collected.

5. The program product according to claim 4, wherein:

said primitive cells comprise an actual digital switching element of the macro such as a transistor or coupling elements; and said special cells comprise load-multipliers, capacitors, resistors, wire models, and sources of voltage or current in the schematic.

6. The program product according to claim 4 further comprising analyzing the description of a macro based on optical switching elements.

7. A computer system for analyzing a macro schematic of a respective hardware macro, in which a common start point and a common end point in a cross-section representing a specific part of said macro, and a hardware macro schematic is selected, said points defining a path within said macro, the computer system comprising:

a flow control tracing said path along a given hierarchy;

a flow control collecting the timing information of each cell being relevant for timing analysis of said path;

a flow control resolving the hierarchical structure of cells in the schematic in order to collect timing analysis information about said selected net;

a flow control outputting said information in a form which allows a compare with the information comprised of said cross-section;

a flow control dividing the given hardware topology information into three categories of cells comprising hierarchical cells, special cells, and primitive cells;

a flow control tracing said path through a given plurality of hierarchy levels; and a flow control entering a deeper hierarchy level, when a hierarchical cell is reached, until all timing information related to primitive cells and special cells associated with said path is collected.

8. The computer system according to claim 7 wherein:

said primitive cells comprise an actual digital switching element of the macro such as a transistor or coupling elements; and said special cells comprise load-multipliers, capacitors, resistors, wire models, and sources of voltage or current in the schematic.

9. The computer system according to claim 7 further comprising a flow control analyzing the description of a macro based on optical switching elements.

* * * * *